United States Patent [19]

Lee

[11] Patent Number: 5,681,439
[45] Date of Patent: Oct. 28, 1997

[54] CONFIGURATION OF AN ANODE-OXIDATION PREVENTING PORTION OF A METAL LINE

[75] Inventor: Jae Kyun Lee, Anyang-si, Rep. of Korea

[73] Assignee: LG Electronics, Inc., Seoul, Rep. of Korea

[21] Appl. No.: 620,314

[22] Filed: Mar. 22, 1996

[30] Foreign Application Priority Data

Oct. 17, 1995 [KR] Rep. of Korea ............................ 35791

[51] Int. Cl.$^6$ ..................................................... C25D 11/00
[52] U.S. Cl. ........................................... 205/50; 205/124
[58] Field of Search ..................... 205/124, 50; 216/11, 216/12, 13, 40, 49; 156/659.11; 257/499

[56] References Cited

U.S. PATENT DOCUMENTS 4,514,253  4/1985  Minezaki ..................... 156/659.11
5,021,850  6/1991  Tanaka et al. ..................... 257/59

FOREIGN PATENT DOCUMENTS 2-246310  1/1990  Japan .

Primary Examiner—John F. Niebling
Assistant Examiner—Brendan Mee

[57] ABSTRACT

A specially configured intermediate structure used in a stage of selective anodization during the manufacture of a circuit. The specially configured intermediate structure includes: a metal line having at least two edges; and a photoresist mask applied over a portion of the metal line that is to remain unanodized. A configuration of each of the edges of the metal line is such that the length of each edge under the mask is greater than the length of the mask. The extra length of the specially configured edge prevents a problem in later stages of the circuit manufacture due to unwanted, and practically unpreventable, seepage of the anodic oxidation chemical under the mask, along the edge, by the anodic oxidation chemical.

18 Claims, 6 Drawing Sheets

CONFIGURATION OF AN ANODE-OXIDATION PREVENTING PORTION OF A METAL LINE

BACKGROUND OF THE INVENTION

1. Field of the Invention

The present invention relates to anode-oxidation of a metal line. More particularly, it relates to a portion of a metal line configured to prevent unwanted anodization due to the anodic oxidation chemical seeping under an anode-oxidation preventing mask layer formed on the desired portion of the metal line.

2. Description of the Related Art

Generally, anode-oxidation, or anodization, is utilized in the manufacture of semiconductor devices to form a uniform insulating layer on the surface of a metal layer. Yet there are two circumstances in which it is not desired to perform the anode-oxidation on certain areas, namely where there is an electric connection with other metals and where there is to be removal of the metal by etching.

Prior art FIG. 1 depicts in detail a portion of a larger grid (not shown) of metal lines on a substrate. The grid at least includes a plurality of horizontal lines 2 connected to at least one vertical line 1. Eventually in the manufacture of a semiconductor device, the metal under the areas corresponding to item 3 will be cut or severed so that there is no connection between each of lines 2 and the line 1. Before such cuts can be made, though, the metal under the areas corresponding to item 3 must remain intact in order to carry out the anodization.

Anodization involves exposing metal lines 1–2 to an anodic oxidation chemical while passing an electric current through the metal lines 1–2. The ensuing electrolytic oxidation process leaves an oxide film (or coating) on the surface of the metal that was exposed to the anodic oxidation chemical. This oxide layer is difficult to penetrate. It must be remembered that under the areas corresponding to item 3 are portions of the metal lines 2 that will be cut later in the semiconductor manufacturing process. To avoid later having to penetrate an oxide layer in the areas corresponding to item 3, an anode-oxidation preventing mask 3 is applied so that the anodic oxidation chemical cannot contact the metal under the areas 3. Yet the seal between the metal under the areas 3 and the anode-oxidation preventing mask 3 is imperfect.

The partial anode-oxidation is attained by two methods. In the first, an anode-oxidation layer is formed on the surface of a metal layer, and the anode-oxidation layer on a portion of the metal layer not requiring the anode-oxidation is removed. In the second, a passivation layer, e.g., a photoresist, is formed on the portion not requiring the anode-oxidation, prior to performing the anode-oxidation.

However, the first method has a drawback of degrading the characteristic of the device due to damage upon the surface of the metal layer. As a result, the second method of forming the anode-oxidation preventing layer on the portion not requiring the anode-oxidation layer, prior to executing the anode-oxidation, has been widely applied.

As one example of the partial anode-oxidation method, a photoresist mask layer is coated on the portion that is not to be oxidized. Later, the photoresist mask layer will be removed via etching upon the metal line on a gate pad portion. This causes an anode-oxidizing electrolytic solution to contact only the portion that was not coated previously with the photoresist. Thus, the partial anode-oxidation is completed.

When the anode-oxidation is prevented by using a photoresist mask layer, a problem exists wherein the anode-oxidizing electrolytic solution seeps under the photoresist mask layer along the edge of the metal line, causing unwanted oxidation. The unwanted anodic oxidation can extend completely along the edge of the metal line. As a consequence, when the metal in this area is etched, the unwanted anode oxidized edge of the metal line remains, preserving an unwanted electrical connection between the metal (3a and 3b of FIG. 1) on either side of the photoresist.

Recently, in order to prevent the penetration of the anodic oxidation chemical into the oxidation preventing portion, several methods have been used, such as enlarging the area of the anode-oxidation preventing photoresist mask layer, increasing a hard-baking temperature to improve the adhesiveness of the photoresist mask layer, etc.

In these cases, if the area of the photoresist layer is increased, the anode-oxidation of the gate pad portion can be prevented because the penetration of the chemical is somewhat restricted.

However, when a highly-integrated device is formed in a substrate of a fixed size, i.e., when device size is maximally reduced, any increase in the photoresist mask layer area makes high integration of a cell difficult. For example, when enlarging the photoresist, there is a size at which the unwanted anode-oxidation extending from both of sides 3a and 3b of FIG. 1 will not connect in the middle. Consequently, the etching can completely remove the metal in the middle. The display area, of the semiconductor device that is ultimately manufactured, is fixed as a practical matter in size, with a peripheral region being dedicated to the circuitry necessary to drive the liquid crystal. There is insufficient space in the peripheral region to permit the mask enlarging technique to be used, i.e., there is not enough space to permit the photoresist to be enlarged enough to prevent the problem.

Meanwhile, if the adhesiveness between the photoresist mask layer and the edge of the metal line is improved by increased temperature hard baking without changing the area of the photoresist mask, then the penetration of the anode-oxidation chemical into the gate pad portion along the edge of the metal line can be slightly decreased.

Yet, such hard baking is carried out at such a high temperature, e.g., 180° C., that it causes the photoresist mask to adhere to the metal so strongly that it is difficult to remove via etching.

The problems with the conventional partial anode-oxidation process by means of the anode-oxidation preventing mask will be further described in detail with reference to FIGS. 1 to 3.

FIG. 1 shows a layout of a metal line in the circumstance in which an anode-oxidation preventing mask 3 partially covers a gate pad portion A.

FIG. 2 is an enlarged view showing the gate pad portion A of FIG. 1.

In the conventional anode-oxidation process, an anodic oxidation electrolytic chemical is applied to the metal line and an electric current is passed through the line causing the exposed metal to be anodized. An oxidation-preventing photoresist mask 3, having a length L and an overhang F of approximately 5 μm, covers a portion of the line for which anode-oxidation is to be prevented, this portion being part of the gate pad portion A on a metal line 1.

Successively, the anode-oxidation process, is executed to anodize only, in theory, the portion which is not covered with the photoresist mask 3.

Here, an edge 5 of the metal line 1, in the area of the anode-oxidation preventing portion coated with photoresist mask 3, is straight. That is, the length of the edge 5 of the metal line 1 coated with photoresist mask 3 is the same as the length L of photoresist mask 3.

Accordingly, the electrolytic anodic oxidation chemical penetrates into the area that is not desired to be anodized via seeping along the edge 5 of the metal line 1, as indicated by the arrows B of FIG. 2. In practice, the edge 5 is imperfectly covered by the photoresist mask 3 during the anode-oxidation process. It is empirically understood that the edge 5 is vulnerable to such seepage because the mask cannot adhere well to the contour of the metal line which makes an approximately 90° change of direction at the edge.

Therefore, as shown in FIG. 3a, when the area of photoresist mask 3 covering the gate pad portion A is reduced, for the purpose of permitting higher integration of a device, the anodic oxidation chemical is likely to penetrate along the edge 5 of the metal line 1 in the area that is not desired to be anodized. Thus, the selective oxidation process becomes difficult.

Consequently, as shown in FIG. 3b, during etching of the metal line portion covered with the photoresist mask 3, an unwanted anode-oxidation portion 7 is formed despite the presence of the photoresist mask layer 3. Although most of the metal 8 under the photoresist mask 3 is removed by the etching, the metal under the unwanted anodization 7 remains. Thus, there remains an unwanted electrical connection between areas 3a and 3b of the metal line 1.

SUMMARY OF THE INVENTION

The present invention is devised to solve the above-described problems. Accordingly, it is an object of the present invention to configure an anode-oxidation preventing portion of a metal line, wherein an edge of the anode-oxidation preventing portion of the metal line is lengthened relative to the length of the mask to block an anode-oxidizing electrolytic solution from seeping under the anode-oxidation preventing portion beyond a predetermined depth, thereby enabling only partial anode-oxidation.

To achieve the above objects of the present invention, there is provided a method of configuring a segment of a metal line having at least two edges, the line being part of a stage in the manufacture of a circuit, to avoid unwanted oxidation of a portion of the line despite the presence of a photoresist mask, the method comprising: configuring the edges of a line segment so that each edge is longer than the length of a photoresist mask that will cover the line segment, such that a portion of the line under the photoresist mask remains completely unanodized.

The objects of the present invention are also fulfilled by providing an intermediate structure used in a stage of selective anodization in the manufacture of a circuit, the structure comprising: a metal line having at least two edges; a photoresist mask applied over a portion of the metal line that is to remain unanodized; wherein a configuration of each edge is such that the length of each edge of the metal line is longer than the length of the photoresist mask, so that a portion of the line under the photoresist mask remains completely unanodized.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objects and other advantages of the present invention will become more apparent by describing in detail preferred embodiments thereof with reference to the attached drawings in which:

FIG. 3b shows the anode-oxidation preventing portion of FIG. 3a and the unwanted electrical connection remaining after performing the etching in FIG. 3a;

DETAILED DESCRIPTION OF THE PREFERRED EMBODIMENTS

Figure 4A:
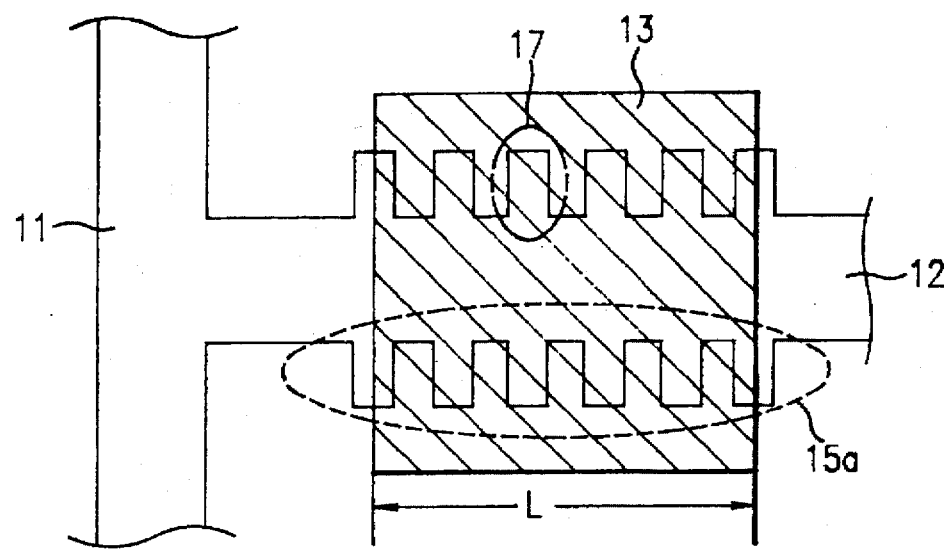
FIGS. 4a–4b show a first configuration of an edge of a metal line, over which is applied an anode-oxidation preventing mask according to a first embodiment of the present invention.

FIG. 4a shows a layout of a first embodiment, i.e., configuration, of an anode-oxidation preventing portion according to the present invention. A mask layer 13 is formed over the anode-oxidation preventing portion of the metal line 12.

In FIG. 4a, an anode-oxidation preventing photoresist mask 13, having a length L, is formed on the anode-oxidation preventing portion, i.e., the portion of the metal line 12 for which oxidation is to be prevented. The mask 13 is formed of a material capable of withstanding being subjected to anode-oxidation.

Here, the configuration of the periphery 15a is a plurality of protrusions 17, substantially resembling a square wave. The periphery 15a is so formed to increase a path length of the edges of the metal line 11 within, and just outside, the area covered with the photoresist mask 13.

Figure 1:
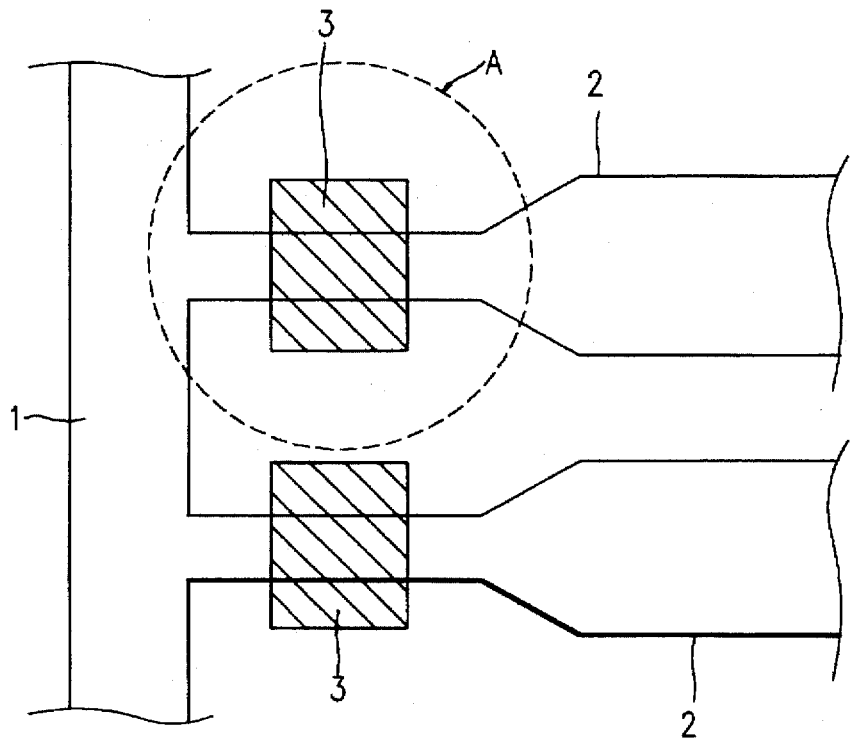
FIG. 1 shows a layout of a metal line having an anode-oxidation preventing mask covering a portion of the metal line for which anodization is desired to be prevented.
Figure 2:
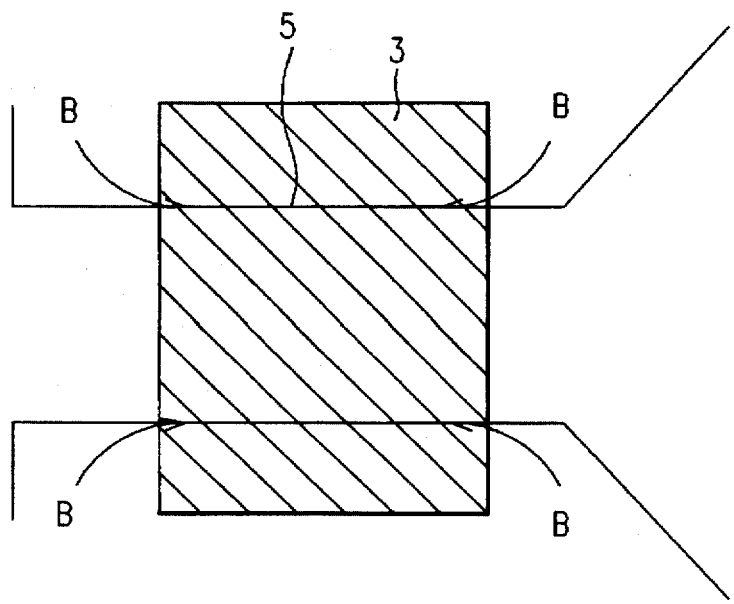
FIG. 2 is an enlarged view showing the gate pad portion A of FIG. 1.
Figure 3A:
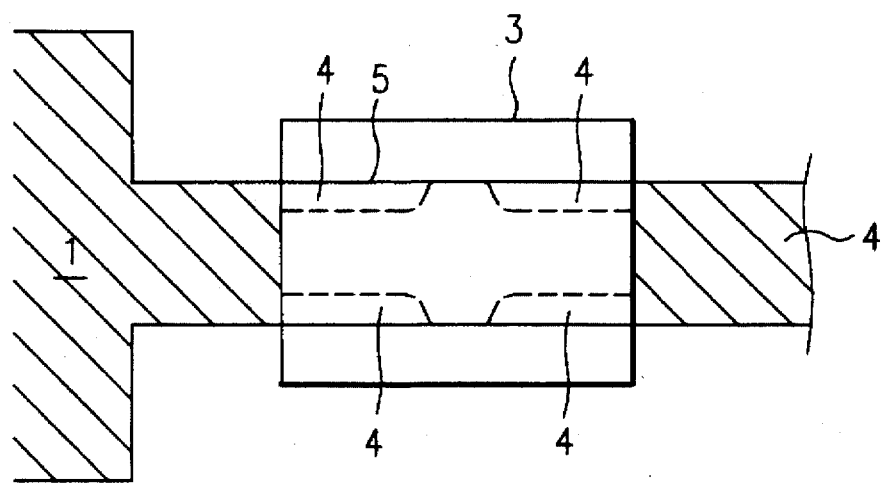
FIG. 3a shows the anode-oxidation preventing portion of FIG. 2 as penetrated by the anodic oxidation chemical.
Figure 3B:
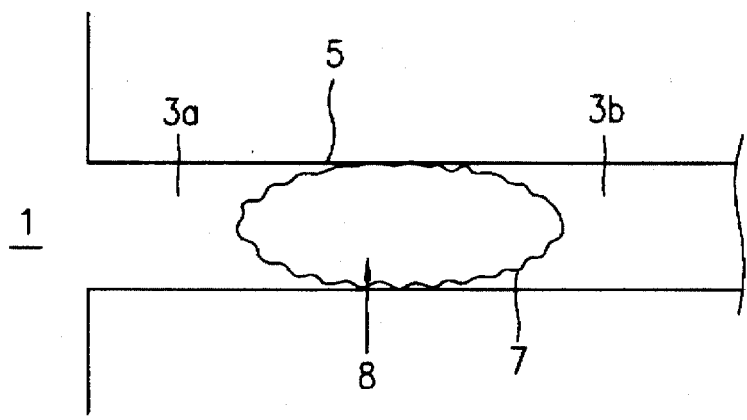

The plurality of protrusions 17 are made by a photolithographic process in which the conventional edge 5 of FIG. 2 is extended to form the periphery 15a. A metal-line forming mask is utilized during the patterning of the periphery 15a of the metal line 11. The periphery 15a of FIG. 4a is, however, idealized.

Figure 4B:
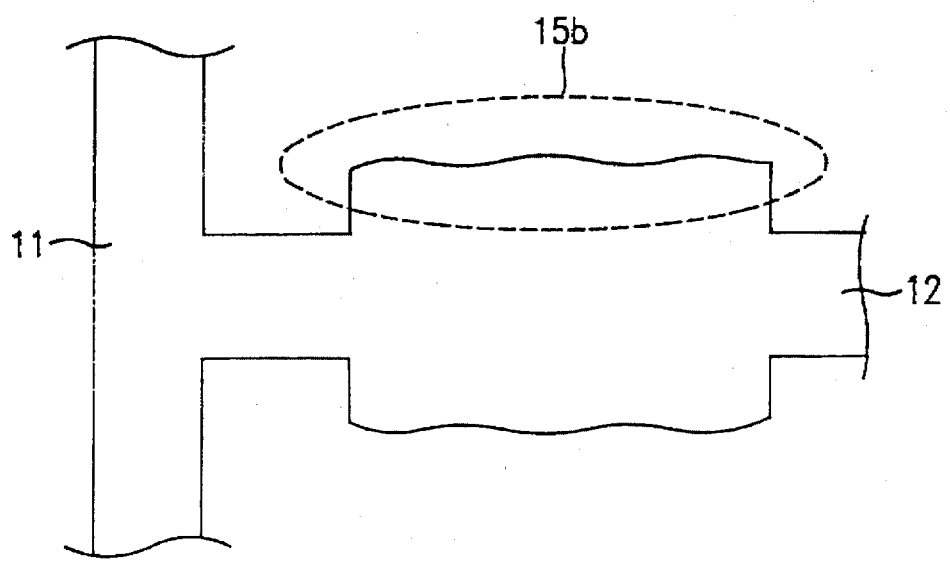

Due to the limits of current photolithography, the actual plurality of protrusions 17 which results in practice is not as square as is desirable, i.e., not as square as the metal mask by which they are made. See the actual periphery 15b of FIG. 4b. The actual rounded protrusions do not produce as long a periphery as the theoretical square protrusions. Until photolithographic techniques improve, the configuration of the periphery 15a of FIG. 6a (to be discussed below) is preferred for consistently achieving an adequate periphery length. Any shape may be adopted for a periphery 15 of the metal line 11 overlapping with the photoresist mask 13, provided that the length of the periphery 15 is longer than the length $L_1$ of the photoresist mask 13. The shape of periphery 15 of the metal line 11, corresponding to the gate pad portion A, may be varied in accordance with the shape of the metal mask.

Figure 6A:
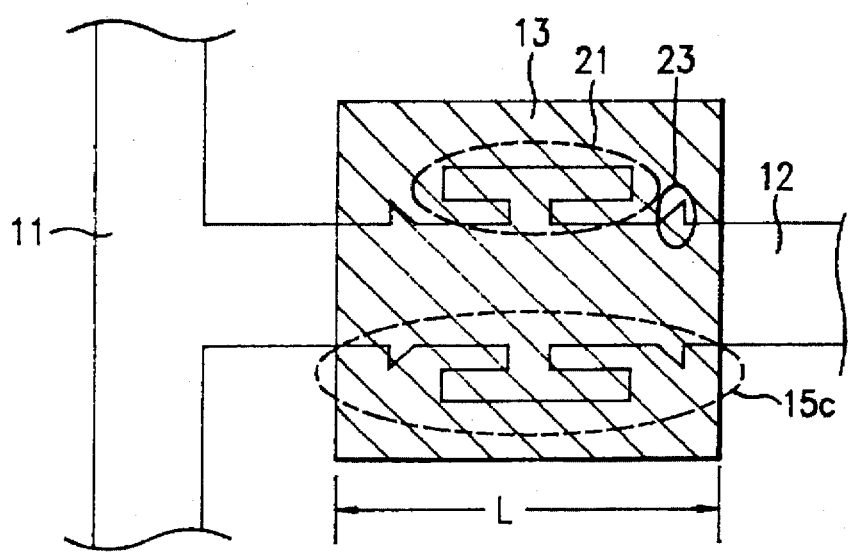
FIGS. 6a–6b show a second configuration of the anode-oxidation preventing portion according to the present invention.
Figure 6B:
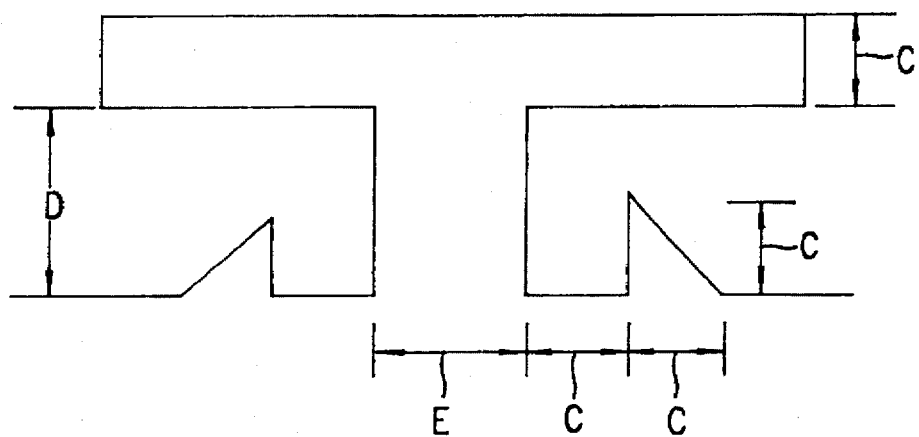

Given the limitations of photolithography, the preferred configuration of the periphery 15 of the metal line 11 is illustrated in FIGS. 6a–6b. The periphery 15c of FIG. 6a includes a T-shaped extension 21 in the middle and at least one triangular (or sawtooth-shaped) extension 23 on either side of the T-shaped extension 21. Exemplary dimensions are presented by FIG. 6b, where C=1 μm, D=2 μm, and E≧5 μm. Additional triangular extensions 23 can be added as needed to achieve an adequate length of the periphery 15c.

Figure 7A:
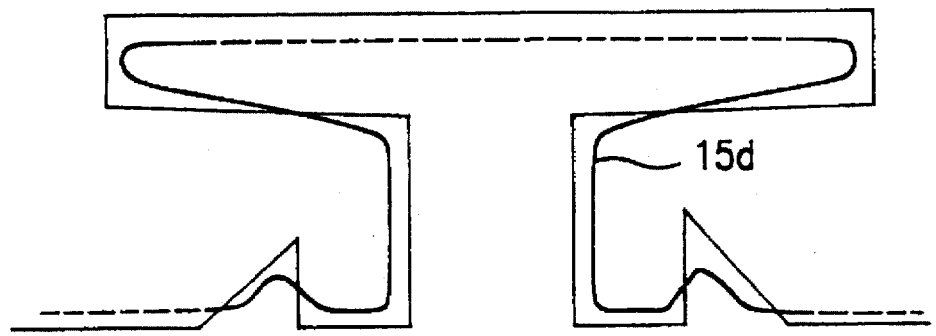
FIGS. 7a–7b show the actual rounded periphery of the second embodiment.
Figure 7B:
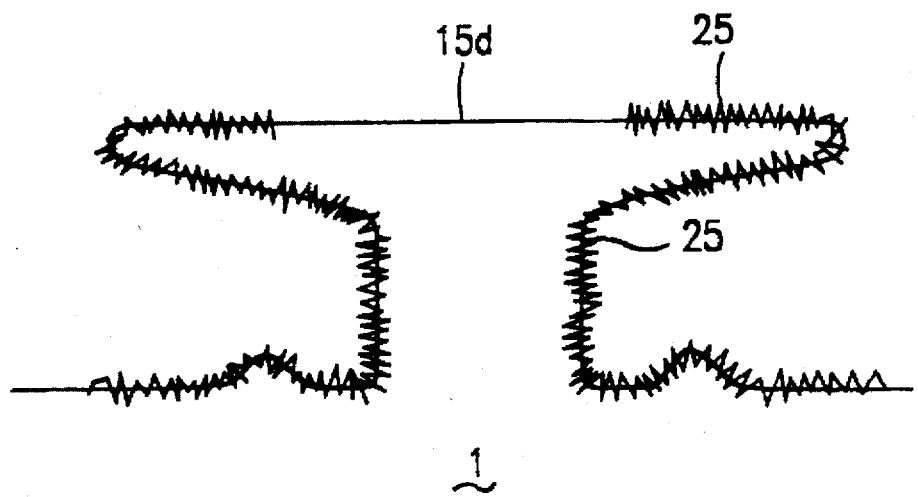

FIG. 7a shows the actual rounded periphery 15d. FIG. 7b shows that, despite being rounded, periphery 15d is of sufficient length so that it prevents the unwanted anodization 25 from converging in the middle, thus it ensures that an unanodized section of metal 1 will remain to be etched away.

Hereinbelow, an operation and effect of the structure of the anode-oxidation preventing portion of the metal line according to the present invention constructed as above will be described.

Figure 5:
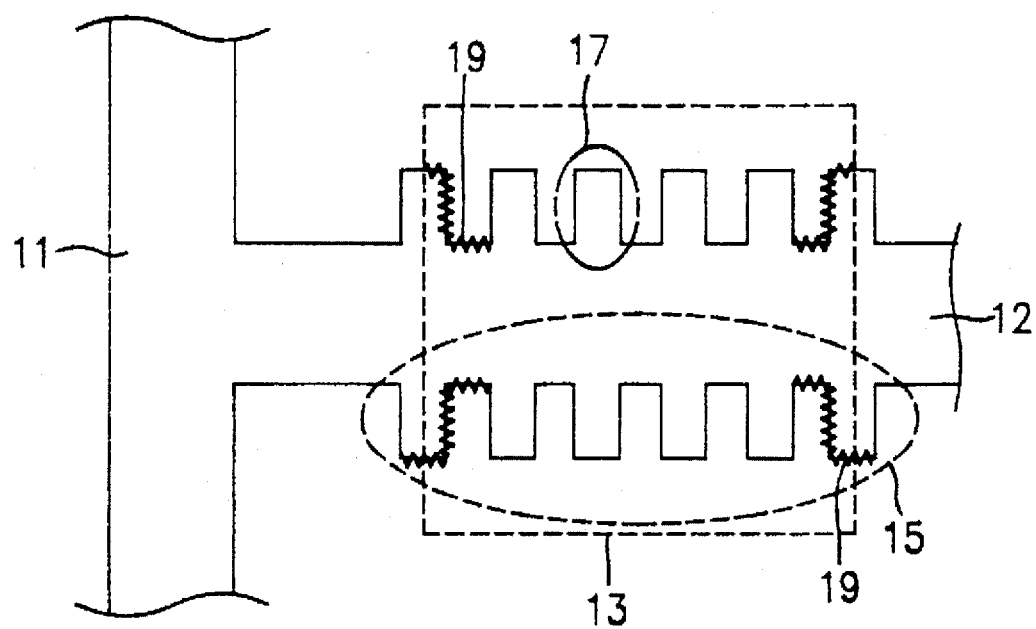
FIG. 5 shows a gate pad portion according to the present invention under the circumstance that an anodic oxidation chemical has penetrated into the anode-oxidation preventing portion.

During the anode-oxidation process of the metal line 11, an anodic oxidation chemical is likely to penetrate into the anode-oxidation preventing portion, defined by the photoresist mask portion, along a predetermined depth. In other words, the anodic oxidation chemical seeps as far in as indicated by the edge segment 19 as shown in FIG. 5 and also the edge segment 25 in FIG. 7b, along the periphery 15 of the metal line 11.

However, the plurality of protrusions 17, formed on the sides of the metal line 11 within the gate pad portion A, covered with the anode-oxidation preventing photoresist mask 13, lengthen a path of the periphery 15. Therefore, the anode-oxidation does not progress beyond a certain length, i.e., not over the entire anode-oxidizing periphery underneath the mask 13. The same situation is true for the configuration of FIG. 6a.

After carrying out the anode-oxidation process, the anode-oxidation preventing photoresist mask 13 is removed. This permits the metal line 11, in the area of the anode-oxidation preventing portion covered with the photoresist mask 13, to be etched.

When the anode-oxidation preventing portion is etched away, by using the etchant having an etch selectivity different from the anode-oxidation layer, only the portion covered with the anode-oxidation layer is left intact. The metal layer underlying the anode-oxidation preventing portion is thoroughly etched away.

By this process, the anode-oxidation preventing portion is completely insulated from the gate array portion to favorably accomplish selective anode-oxidation.

As described above, the plurality of protrusions are formed at the sides of the metal line in the area corresponding to the anode-oxidation preventing portion. The objective is to lengthen the periphery, thereby preventing undesired anodization in the anode-oxidation preventing portion via unwanted penetration along the periphery of the metal line by the anodic oxidation chemical.

Compatible with the design goal of minimizing the size of the anode-oxidation preventing portion, which furthers the manufacture of highly-integrated devices, the configurations of the present application enable the length of the metal line segment defining the anode-oxidation preventing portion to be increased via the above-stated method (i.e., the formation of protrusions). Accordingly, the penetration of an etchant beyond an empirically determined percentage of the periphery of the metal line, within the anode-oxidation preventing portion, can be blocked.

As a result, anode-oxidation upon an undesired portion can be prevented, thereby making the specially configured structures, of the anode-oxidation preventing portion according to the present invention, suitable for achieving high integration.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A method of anodizing a line segment of a metal line under a photoresist, the metal line having at least two edges, the metal line being part of a stage in the manufacture of a circuit, to avoid unwanted oxidation of a segment of the metal line despite the presence of a photoresist mask, the method comprising:

configuring the edge of a first line segment of the metal line so that each edge of the first line segment is longer than the length of a corresponding edge of a photoresist mask that will cover the first line segment; and anodizing the metal line such that a second segment of the metal line under the photoresist mask will remain completely unanodized.

2. A method as in claim 1, wherein the step of configuration includes:

configuring the edges to substantially resemble a square wave.

3. A method as in claim 1, wherein the step of configuring further includes:

configuring the edges to substantially resemble a T-shape.

4. A method as in claim 3, wherein the step of configuring further includes:

configuring the edges to also include a triangle-shape on at least one side of the T-shape.

5. A method as in claim 4, wherein:

the at least one triangle-shape is substantially smaller than the T-shape.

6. A method as in claim 1, wherein a first one of said edges of the first line segment is of a different length than a second one of the edges.

7. An intermediate structure used in a stage of selective anodization in the manufacture of a circuit, the structure comprising:

a metal line having at least two edges;

a photoresist mask applied over a first segment of the metal line that is to remain unanodized;

wherein a configuration of each edge of the first segment is such that the length of each edge of the first segment of the metal line below the photoresist mask is longer than the length of the corresponding edge of the photoresist mask covering the first segment of the metal line, so that a second segment of the metal line under the photoresist mask will remain completely unanodized.

8. A structure as in claim 7, wherein:

the configuration substantially resembles a square wave.

9. A structure as in claim 7, wherein:

the configuration substantially resembles a T-shape.

10. A structure as in claim 9, wherein:

the configuration also includes a triangle-shape on at least one side of the T-shape.

11. A structure as in claim 10, wherein:

the at least one triangle-shape is substantially smaller than the T-shape.

12. An apparatus as in claim 7, wherein a first one of said edges of the first line segment is of a different length than a second one of the edges.

13. A method preventing unwanted anodization of a segment of a metal line having at least two edges, the metal line being part of a stage in the manufacture of a circuit, the method comprising:

forming the metal line, having the at least two edges, on a substrate, the step of forming the metal line including:

configuring the edges of a first line segment of the metal line so that each edge is longer than the length of a corresponding edge of a photoresist mask that will cover the first line segment;

forming the photoresist mask over the first line segment; and anodizing the metal line except for a second line segment of the metal line under the photoresist mask remaining completely unanodized due to the length of the edges of the first line segment being longer than the length of a corresponding edge of the photoresist mask covering the first line segment.

14. A method as in claim 13, wherein the step of configuring includes:

configuring the edges to substantially resemble a square wave.

15. A method as in claim 13, wherein the step of configuring further includes:

configuring the edges to substantially resemble a T-shape.

16. A method as in claim 13, wherein the step of configuring further includes:

configuring the edges to also include a triangle-shape on at least one side of the T-shape.

17. A method as in claim 16, wherein:

the at least one triangle-shape is substantially smaller than the T-shape.

18. A method as in claim 13, wherein a first one of said edges of the first line segment is of a different length than a second one of the edges.

* * * * *